US006556418B2

(12) United States Patent
Aigner et al.

(10) Patent No.: US 6,556,418 B2
(45) Date of Patent: Apr. 29, 2003

(54) MICROMECHANICAL COMPONENT AND PROCESS FOR ITS FABRICATION

(75) Inventors: Robert Aigner, München (DE); Hergen Kapels, Neubiberg (DE); Klaus-Günter Oppermann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 53 days.

(21) Appl. No.: 09/795,098

(22) Filed: Feb. 28, 2001

(65) Prior Publication Data

US 2001/0021538 A1 Sep. 13, 2001

Related U.S. Application Data

(63) Continuation of application No. PCT/DE99/02573, filed on Aug. 17, 1999.

(30) Foreign Application Priority Data

Aug. 31, 1998 (DE) .......................... 198 39 606

(51) Int. Cl.$^7$ ................................. H01G 7/00
(52) U.S. Cl. ................... 361/283.1; 361/280; 361/283; 361/285.3; 361/283.4; 257/417; 257/419; 438/52; 438/53
(58) Field of Search ............................ 361/283.1, 283, 361/283.3, 283.4, 286; 257/17, 15, 417, 419; 438/56, 53, 52

(56) References Cited

U.S. PATENT DOCUMENTS 5,177,661 A 1/1993 Zavracky et al.
5,357,807 A * 10/1994 Guckel et al.
5,698,112 A * 12/1997 Naeher et al.

(List continued on next page.)

FOREIGN PATENT DOCUMENTS

DE  40 04 179 A1  8/1991
EP  0 872 720 A1  10/1998
EP  0 947 816 A2  10/1999

OTHER PUBLICATIONS

International Publication WO 94/17383 (Mokwa et al.), dated Aug. 4, 1994.
H. Dudaicevs et al.: "A Fully Integrated Surface Micromachined Pressure Sensor With Low Temperature Dependence", The 8$^{th}$ International Conference on Solid–State Sensors and Actuators, and Eurosensors IX, Stockholm, Sweden, Jun. 25–29, 1995, pp. 616–619.
T. Scheiter et al.: "Full integration of a pressure sensor system into a standard BiCMOS—process", The 11$^{th}$ European Conference on Solid State Transducers, Warsaw, Poland, Sep. 21–24, 1997, pp. 1595–1598.

(List continued on next page.)

Primary Examiner—Anthony Dinkins
Assistant Examiner—Nguyen Ha
(74) Attorney, Agent, or Firm—Laurence A. Greenberg; Werner Stemer; Ralph E. Locher

(57) ABSTRACT

A micromechanical component placed on a substrate face includes at least one cell. A counter-electrode of a cell capacitor is placed under a cavity. The counter-electrode can be made from a first part of a lower conductive layer. An optionally circular membrane used as an electrode of the capacitor is placed above the cavity. The membrane is homogeneous, has a substantially uniform thickness, and can be part of an upper conductive layer preferably supported by a second part of the lower conductive layer. A caustic channel used to remove the sacrificial coating in order to form the cavity is laterally connected thereto. The channel has a vertical dimension equal to the vertical dimension of the cavity. A closure is adjacent to the channel and disposed outside the membrane. The component can be used as a pressure sensor, and can have several cells each adjacent to six other cells. A process for fabricating a micromechanical component is also provided.

11 Claims, 3 Drawing Sheets

U.S. PATENT DOCUMENTS 5,834,332 A * 11/1998 Hierold et al.
5,939,171 A * 8/1999 Biebl.
5,983,721 A * 11/1999 Sulzberger et al.
6,118,164 A * 9/2000 Seefeldt et al.
6,140,689 A * 10/2000 Scheiter et al.
6,159,762 A * 12/2000 Scheiter et al.
6,320,239 B1 * 11/2001 Eccardt et al.
6,401,544 B2 * 6/2002 Aigner et al.

OTHER PUBLICATIONS

M. Habibi et al.: "A surface micromachined capacitive absolute pressure sensor array on a glass substrate", Sensors and Actuators A 46–47 (1995), pp. 125–128 Jun. 1995.

Günter Ehrler: "Piezoresistive Silizium–Elementardrucksensoren", [piezoresistive silicone pressure sensors], Sensor Magazin 01–92, pp. 10–16.

* cited by examiner

MICROMECHANICAL COMPONENT AND PROCESS FOR ITS FABRICATION

CROSS-REFERENCE TO RELATED APPLICATION

This application is a continuation of copending International Application No. PCT/DE99/02573, filed Aug. 17, 1999, which designated the United States.

BACKGROUND OF THE INVENTION

Field of the Invention

The invention relates to a micromechanical component and a process for its fabrication.

With a view to ever faster and smaller circuit configurations, attempts are made to integrate an electronic circuit together with a micromechanical component, for example, a sensor or an actuator, into a single chip.

In T. Scheiter et al., "Full integration of a pressure sensor system into a standard BiCMCOS-Process", Eurosensors XI, 11th European Conference on Solid State Transducers, Warsaw, Poland (1997) 1595, a pressure sensor is described that is produced in a standard BiCMOS process on a surface of a silicon substrate. To produce the pressure sensor, a doped region, which acts as a first capacitor electrode of a capacitor, is produced at the surface of the substrate. A field oxide 600 nm thick, which serves as a sacrificial layer, is produced over the doped region. A layer of polysilicon 400 nm thick is deposited over the sacrificial layer. Openings are produced in the polysilicon layer. Then, through these openings, part of the sacrificial layer is removed by etching, which produces a cavity under the polysilicon layer. The openings are closed by a further deposited layer. The further layer is then structured such that parts of the polysilicon layer that are disposed above the cavity are exposed. Parts of the polysilicon layer and parts of the further layer, which are disposed respectively above the cavity, form a membrane. In the region of the openings, the membrane has thickened portions, at which it is inflexible. The parts of the polysilicon layer that are parts of the membrane act as second capacitor electrodes of the capacitor. As a result of deflection of the membrane because of a pressure, the distance between the first capacitor electrode and the second capacitor electrode is changed, which changes the capacitance of the capacitor, which is a measure of the pressure. The size of the area of the exposed parts of the polysilicon layer, that is to say, a deformable region of the membrane, determines the stiffness of the membrane. The higher the pressure range to be measured, the smaller the deformable region should be. One disadvantage is that mechanical loading brought about by the deflection is substantially distributed only to deformable parts of the membrane. For pressures that are greater than about 20 bar, such a pressure sensor is not suitable because the mechanical loading of the deformable membrane regions is close to the fracture limit. Moreover, process fluctuations, such as lithography faults, have an unmanageably large influence on the stiffness of the membrane because of the small size of the deformable regions.

In G. Ehrler, "Piezoresistive Silizium-Elementardrucksensoren" [Piezoresistive silicon-element pressure sensors], Sensormagazin 1/92, 10, a pressure sensor is described in which the pressure is measured with the aid of the piezoresistive effect. Four diffusion regions are produced on a surface of a silicon substrate and are connected to form a Wheatstone bridge. A passivation layer is disposed over the diffusion regions. An opening is produced in a rear of the substrate that reaches as far as the diffusion regions. The depression forms a pressure chamber that, for absolute pressure sensors, is under vacuum and is closed from below. A layer of the substrate, in which the diffusion regions are disposed and which is disposed above the pressure chamber, acts as a membrane of the pressure sensor. A pressure that acts on the passivation layer deflects the membrane, which produces stresses in the membrane. Because of the piezoelectric effect, the stresses lead to changes in the electrical conductivity of the layer of the substrate and, therefore, to changes in the magnitudes of the resistances of the diffusion regions, which are a measure of the pressure. Such a sensor is suitable as a high-pressure sensor. However, the process outlay for producing such a sensor is very high, in particular, due to the processing of the silicon substrate both on the front and on the rear.

In H. Dudaicevc et al., "A fully integrated surface micromachined pressure sensor with low temperature dependence", Transducers '95 Eurosensors IX (1995) 616, a pressure sensor is described in which a cell includes a first electrode of a capacitor, which is implemented at a doped region on a surface of a silicon substrate. An insulating layer of silicon nitride is applied to the surface. A sacrificial layer of oxide is deposited over the insulating layer and is structured such that it fills a cavity to be produced and has a diameter of about 100 $\mu$m. A thin oxide layer is then deposited and structured to make a spur of oxide laterally adjoin the sacrificial layer. Then, a layer of polysilicon is deposited and structured to cover the sacrificial layer and part of the spur. By etching the oxide selectively with respect to polysilicon and silicon nitride, the thin oxide layer and the sacrificial layer are removed, the spur acting as an etching channel. The cavity is formed under the polysilicon layer. The polysilicon layer is supported on the silicon nitride layer. To seal off the cavity, oxide is deposited and closes the etching channel laterally. To completely cover the etching channel, it is important that the thin oxide layer not be too thick. As a result, the etching process is slow and possibly incomplete. In addition, an etching medium used can be flushed out only with difficulty. A number of identical cells are disposed in an x-y grid and connected in parallel with one another.

SUMMARY OF THE INVENTION

It is accordingly an object of the invention to provide a micromechanical component and process for its fabrication that overcomes the hereinafore-mentioned disadvantages of the heretofore-known devices and methods of this general type and that can be configured as a high-pressure sensor and, as compared with the prior art, can be fabricated with a low process outlay or with a higher process reliability.

With the foregoing and other objects in view, there is provided, in accordance with the invention, a micromechanical component, including at least one cell having a cavity with a given vertical dimension, a membrane acting as an electrode of a capacitor of the at least one cell, the membrane homogeneously disposed with a substantially uniform thickness over the cavity, a counter-electrode of the capacitor disposed under the cavity, at least one etching channel laterally adjoining the cavity, the at least one etching channel having a vertical dimension equal to the given vertical dimension, and at least one closure adjoining the at least one etching channel from above and disposed outside the membrane.

The objectives of the invention are achieved by a micromechanical component that includes at least one cell having a membrane that acts as an electrode of a capacitor of the cell and that is disposed with substantially uniform thickness over a cavity in the cell. Disposed under the cavity is a mating or counter electrode of the capacitor. At least one etching channel laterally adjoins the cavity. The etching channel has a vertical dimension equal to a vertical dimension of the cavity. A closure adjoins the etching channel from above.

With the objects of the invention in view, there is also provided a process for fabricating a micromechanical component, including the steps of producing a sacrificial layer over a counter-electrode of a capacitor of a cell, structuring the sacrificial layer to fill a region of a cavity to be produced in the cell and to fill an etching channel laterally adjacent to the cavity, conformally applying an upper conductive layer over the sacrificial layer, producing an opening into the upper conductive layer through the etching channel reaching as far as the sacrificial layer, etching the sacrificial layer to produce the cavity, a part of the upper conductive layer disposed over the cavity becoming capable of being deflected and acting as a membrane of the cell and as an electrode of the capacitor, and closing the etching channel in a region of the opening from above with a closure.

The objectives of the invention are achieved by a process for producing a micromechanical component in which a sacrificial electrode is produced over a mating or counter electrode of a capacitor of a cell of the component and is structured such that it fills a region of a cavity to be produced in the cell and has an etching channel laterally adjacent to the cavity. Conductive material is applied conformally over the sacrificial layer. Above the etching channel, an opening is produced that reaches as far as the sacrificial layer. The sacrificial layer is removed in an etching step, which produces the cavity, and a part of the conductive material disposed above the cavity becomes capable of being deflected and can act as a membrane of the cell and as an electrode of the capacitor. The etching channel in the region of the opening is closed from above by a closure. The process can be compatible with CMOS process technology.

The micromechanical component is based on the capacitive measurement principle. At least part of the cavity is part of a capacitor dielectric that is configured as an air gap and belongs to a capacitor whose capacitance is a measure of a pressure on the membrane. As such, the micromechanical component may be used, for example, as a pressure sensor or as a microphone.

Because a sacrificial layer is provided, the removal of which produces the cavity, the micromechanical component can be disposed on a surface of a substrate. As such, processing of a rear of the substrate is not necessary. Accordingly, the process outlay is lower when compared with a pressure sensor according to the Ehrler document. As opposed to the pressure sensor according to the Scheiter document, the membrane does not have any particularly thin points that could fracture particularly easily as a result of pressure. Nor does the membrane have any thickened portions where local load peaks would be produced at edges thereof that could lead to fracture of the membrane. The pressure is distributed uniformly over the membrane because the membrane is substantially uniformly thick. As a result, the membrane is more stable than the membrane according to the Scheiter document. During the removal of the etching medium used to etch the sacrificial layer, high capillary forces act on the membrane. If the membrane has particularly thin, that is to say soft, membrane parts, as in the case of the pressure sensor according to the Scheiter document, then they can remain stuck to the bottom of the cavity. Therefore, a further advantage of the uniformly thick membrane is that the membrane is mechanically very stable, even during the fabrication process.

The large vertical dimension of the etching channel is not an obstacle to sealing the cavity because the closure adjoins the etching channel from above. Such a feature is in contrast with the pressure sensor according to the Dudaicevc document.

The etching process proceeds more quickly and an etching agent can be flushed out more easily. As compared with the pressure sensor according to the Dudaicevc document, the micromechanical component may be produced with higher process reliability.

The sacrificial layer can be removed without having to produce an opening in the membrane because an etching channel is provided that laterally adjoins the sacrificial layer. Therefore, the membrane can be produced homogeneously and with a substantially equal thickness. The closure is located outside the membrane.

In accordance with another feature of the invention, the membrane can be part of an upper conductive layer that adjoins the cavity from above and laterally. As such, the sacrificial layer is applied to the entire area and then structured by masked etching. The upper conductive layer is then deposited to cover the sacrificial layer and surround it laterally. Apart from a region in which the etching channel adjoins the cavity, the upper conductive layer surrounds the cavity.

Alternatively, the cavity is surrounded laterally by a different material. For example, the sacrificial layer can be produced in a depression in the other material. Alternatively, the sacrificial layer is structured by masked etching and then the other material is deposited and planarized. The upper conductive layer is applied thereover.

The mating electrode can be implemented as a doped region in the substrate.

In order to avoid p-n junctions and associated depletion-layer capacitances and voltage restrictions, it is advantageous if the mating electrode is a first part of a structured lower conductive layer that is disposed on a first insulating layer that, in turn, is disposed on the surface of the substrate. The first insulating layer expediently has a thickness at which a capacitance formed by the mating electrode and the substrate is kept small.

In accordance with a further feature of the invention, there are provided a substrate having a surface, a first insulating layer being disposed on the surface, and a structured lower conductive layer having a first part and a second part, the lower conductive layer being disposed on the first insulating layer, the first part being the counter-electrode, and the upper conductive layer being supported on the second part of the lower conductive layer and being insulated from the first part of the lower conductive layer.

The upper conductive layer is preferably supported on a second part of the structured lower conductive layer. The second part of the structured lower conductive layer acts as an etch stop during the structuring of the sacrificial layer. The second part of the structured lower conductive layer is separated from the mating electrode such that the membrane, acting as the electrode, is not electrically connected to the mating electrode. The mating electrode can broaden underneath the etching channel, but otherwise occupies a smaller area than the cavity; that is to say, a horizontal cross section of the mating electrode in the region of the cell is smaller than a horizontal cross section of the cavity. For the capacitance of the capacitor of the cell to be as high as possible, the mating electrode occupies the greatest possible area. In other words, the area occupied by the mating electrode has the same shape as the area of the cavity and reaches virtually up to the edges of the cavity.

It is expedient if the first insulating layer and the sacrificial layer are made of the same material, for example, $SiO_2$.

In accordance with an added feature of the invention, there is provided a second insulating layer disposed on the lower conductive layer with the cavity bounded from below by the second insulating layer.

In accordance with yet a further mode of the invention, a first insulating layer is produced on a substrate. A lower conductive layer is deposited over the first insulating layer and the lower conductive layer is structured to produce a first part of the lower conductive layer forming a counterelectrode and to produce a second part of the lower conductive layer separated from the first part. A second insulating layer is produced over the first conductive layer. The sacrificial layer is produced over the second insulating layer. The sacrificial layer is to be etched selectively with respect to the second insulating layer. The second insulating layer and the sacrificial layer are analogously structured to have the second insulating layer completely cover the first part of the lower conductive layer with the second part of the lower conductive layer acting as an etch stop. The upper conductive layer is produced over the sacrificial layer to partly adjoin the upper conductive layer laterally with the sacrificial layer.

If the sacrificial layer and the first insulating layer are made of the same material, it is advantageous if the sacrificial layer does not directly adjoin the first insulating structure in the region between the mating electrode and the second part of the structured lower conductive layer because the first insulating structure will otherwise be attacked as well. It is expedient to produce over the structured first conductive layer a second insulating layer, which can be etched selectively with respect to the sacrificial layer and with respect to the first insulating layer and over which the sacrificial layer is produced. The second insulating layer is structured in an analogous way to the sacrificial layer. In the region between the mating electrode and the second part of the structured lower conductive layer, the second insulating layer directly adjoins the first insulating layer and protects the latter during the removal of the sacrificial layer.

An electrical connection to the membrane can be made outside the cell through the second part of the structured lower conductive layer.

In accordance with an additional feature of the invention, the membrane has a substantially circular cross section, the at least one etching channel is at least three etching channels disposed at equal distances from one another, the at least one cell is a plurality of identical cells, respective groups of three of the cells adjoining one another have respective centers lying at corners of an equilateral triangle, and three etching channels of three different cells meet one another in a region over which the closure is disposed, the closure disposed between the three different cells.

It is advantageous if the membrane has a substantially circular cross section. As opposed to angular cross sections, the pressure is distributed more uniformly over the membrane to make the membrane more stable.

For exerting an external pressure over a large area, it is advantageous if the micromechanical component has a number of identical cells. Cavities in the cells are preferably connected to one another through the etching channels so that air pressures in the cavities substantially coincide. The connection also makes easier the diagnosis of membrane damage.

The closer the closures lie to one another, the easier the sacrificial layer may be removed. Consequently, it is advantageous if a diameter of the membranes is small and, for example, is between 10 $\mu$m and 30 $\mu$m. The size also results in a particularly high stability of the membranes. Because, in the case of a small diameter, the membranes are more difficult to deflect, the micromechanical component is suitable as a high-pressure sensor, particularly, as a high-pressure sensor for measuring pressures over 40 bar.

It is advantageous to configure the cells as closely to one another as possible because, with the same area of the micromechanical component, the sensitivity of the micromechanical component is increased as a result. If the membrane has a circular cross section, then the cells are preferably disposed in a hexagonal grid. In each case, three of the cells adjoin one another, with their centers lying at corners of an equilateral triangle. Consequently, a cell adjoins six cells disposed annularly around the cell. The cell can have three etching channels that are at equal distances from one another. In each case, three etching channels of different cells meet one another in a region over which the closure is disposed and which lies between these cells.

Instead of adjoining one another, the cells can be spaced apart from one another.

The cell can also have a number of etching channels differing from three.

In accordance with yet another feature of the invention, the mating electrodes of the cells can cohere through conductive webs running in the etching channels and, together with the webs, can form a first part of the structured first conductive layer. The first part of the structured lower layer acts as a common mating electrode of the cells.

The pressure range of the pressure sensor can be determined through the choice of the thickness of the membrane and the size of the horizontal cross section of the membrane. For a pressure range between 40 bar and 200 bar, the radius of the membrane is preferably between 13 $\mu$m and 7 $\mu$m.

The thinner the sacrificial layer, the greater is the change in the capacitance as the pressure changes. The thickness of the sacrificial layer is preferably between 200 nm and 500 nm.

The closure is produced, for example, by depositing and fusing boron phosphorous silicate glass (BPSG).

A number of layers of different materials can also be deposited in order to produce the closure or the upper conductive layer.

The lower conductive layer can be produced at the same time as upper capacitor electrodes of capacitors at the periphery of the micromechanical component or of capacitors in other parts of the substrate.

The first insulating layer and the sacrificial layer contain $SiO_2$, for example. However, the use of other insulating materials lies within the scope of the invention. The second insulating layer can contain silicon nitride, for example. However, the use of other insulating material is likewise within the scope of the invention. The upper and the lower conductive layer contain, for example, doped polysilicon or another conductive material that, for example, contains metal. The $SiO_2$ can be grown thermally or deposited. It is advantageous to apply a coating layer of silicon nitride or titanium nitride over the membrane, which protects the membrane against environmental influences.

Other features that are considered as characteristic for the invention are set forth in the appended claims.

Although the invention is illustrated and described herein as embodied in a micromechanical component and process for its fabrication, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
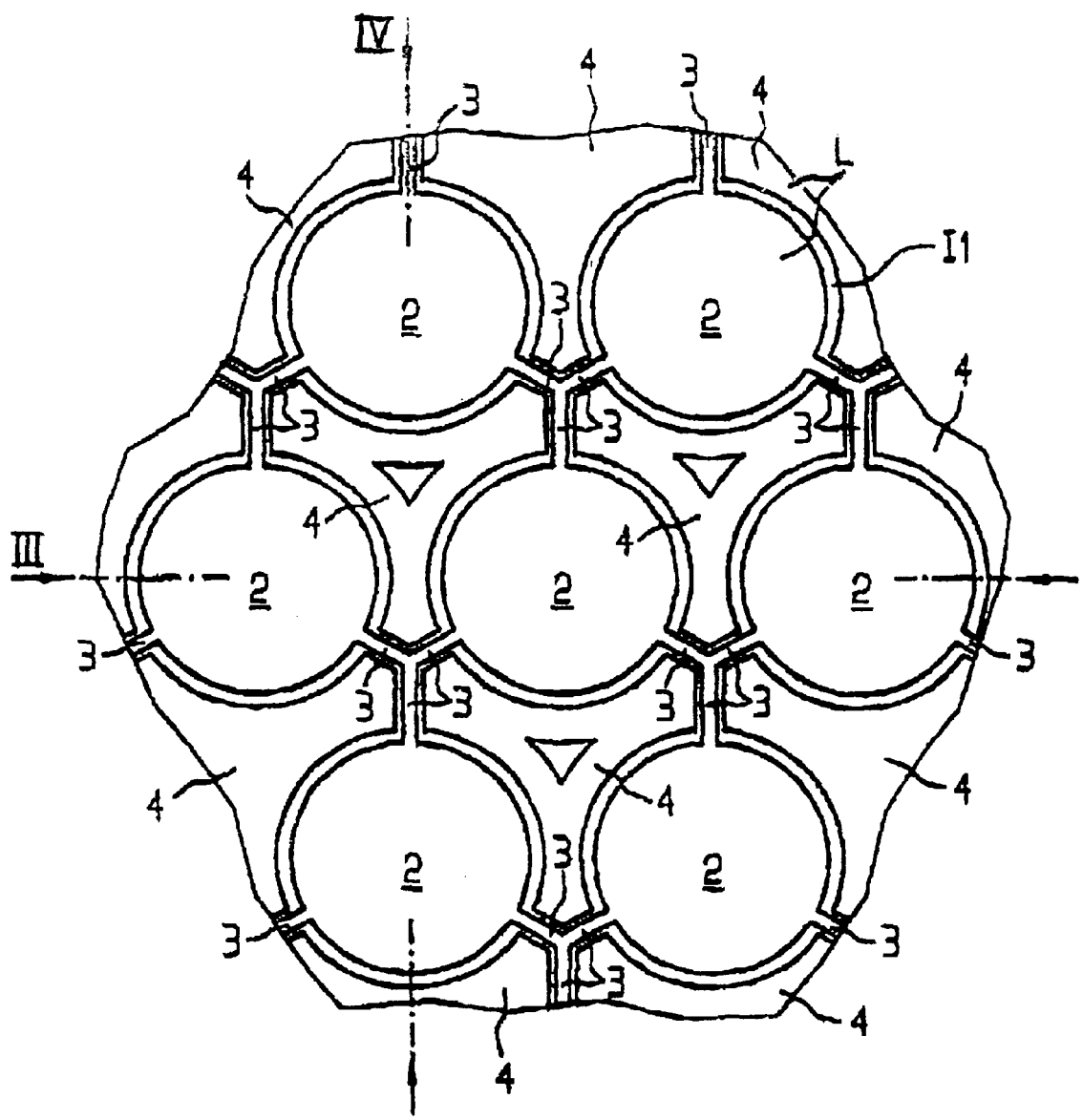
FIG. 1 is a fragmentary, plan view of a substrate having a structured lower conductive layer according to the invention.

In all the figures of the drawing, sub-features and integral parts that correspond to one another bear the same reference symbol in each case.

Figure 3:
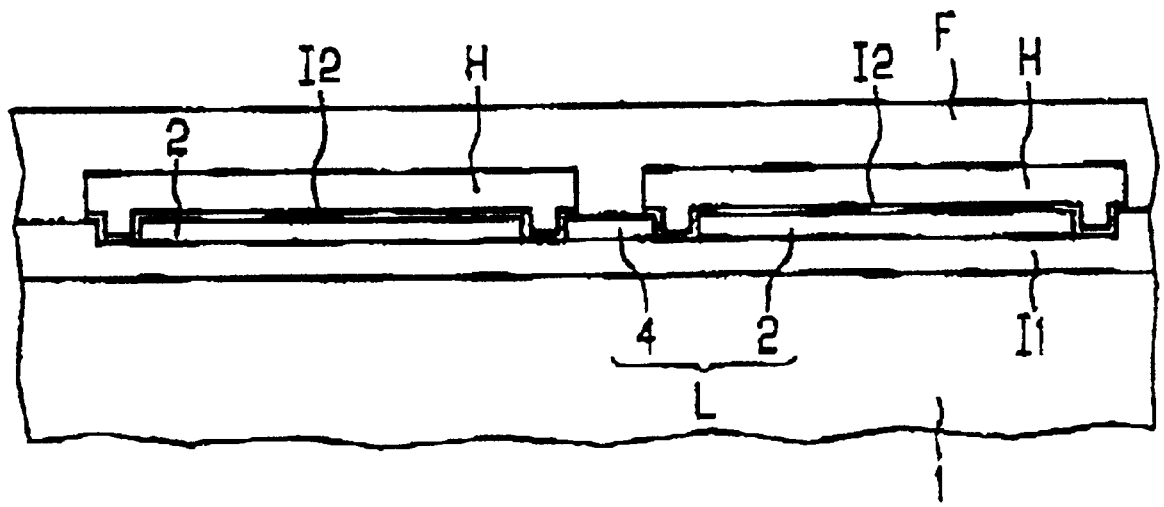
FIG. 3 is a cross-sectional view through the substrate of FIG. 1 after a pressure sensor has been produced according to the invention.

Referring now to the figures of the drawings in detail and first, particularly to FIGS. 1 and 3 thereof, there is shown a first insulating layer I1 produced on a surface of a substrate 1 made of silicon by depositing $SiO_2$ to a thickness of about 600 nm (see FIG. 3).

In order to produce a conductive layer L, polysilicon is then deposited to a thickness of about 200 nm and implanted.

The conductive layer L is structured by plasma etching. The etching produces a first part of the conductive layer L, which includes circular mating electrodes 2 of capacitors and webs 3. See FIG. 1. The mating electrodes 2 have a diameter of about 10 $\mu$m and each have six directly adjacent mating electrodes 2. Adjoining each mating electrode 2 are three of the webs 3, which are at equal distances from one another. In each case, three of the webs 3 meet one another.

Disposed outside the first part of the conductive layer L are second parts 4 of the conductive layer L, which are separated from the first part of the conductive layer L (see FIG. 1). To produce a second insulating layer I2, silicon nitride is deposited to a thickness of about 30 nm. To produce a sacrificial layer, $SiO_2$ is deposited to a thickness of about 300 nm over the second insulating layer I2. See FIG. 3.

Figure 2:
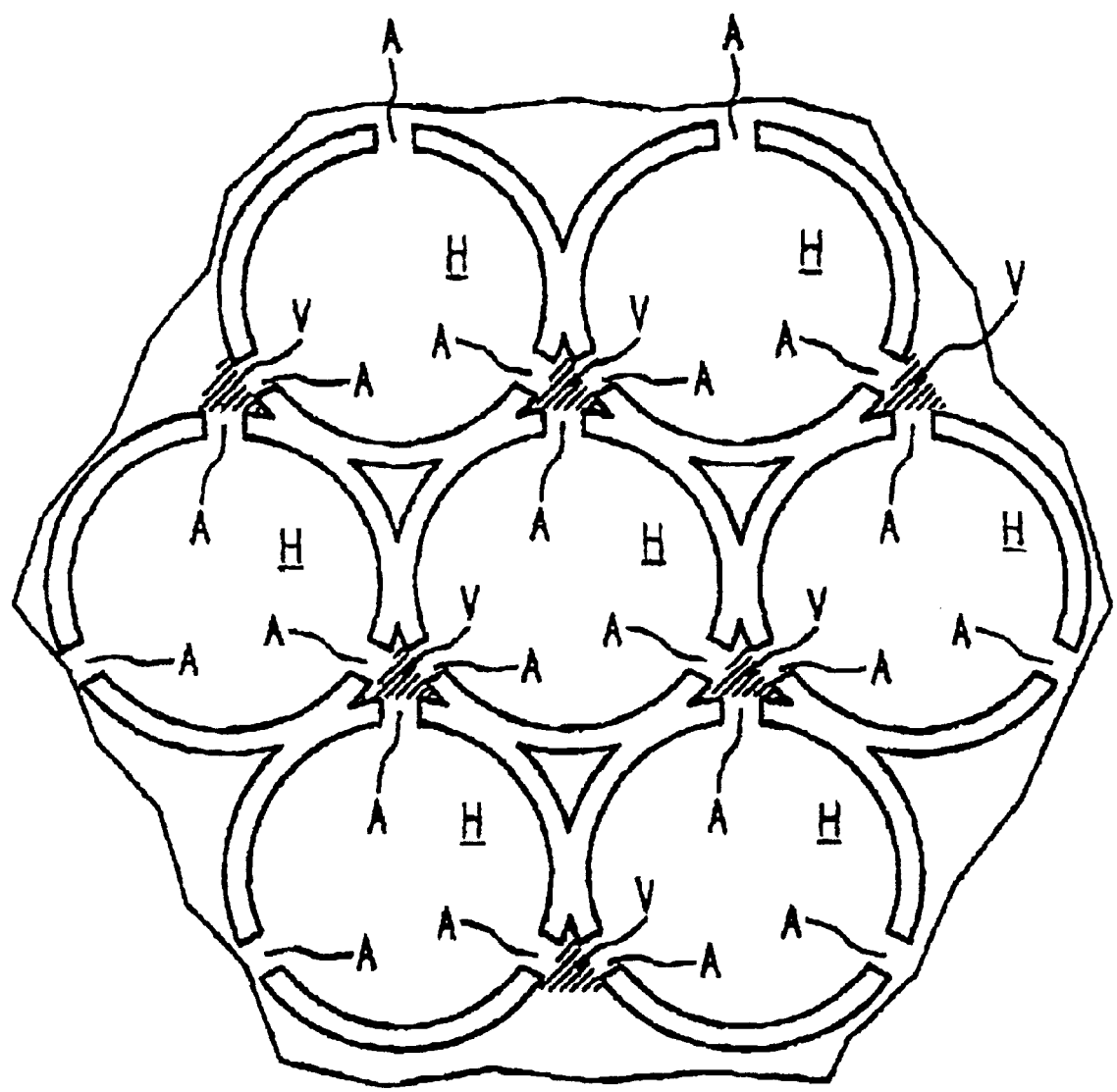
FIG. 2 is a plan view of the substrate having a cavity and closures according to the invention.

The sacrificial layer and the second insulating layer I2 are structured by dry etching. The structuring is carried out in an analogous way to the structuring of the conductive layer L, with the difference that dimensions are chosen such that a part of the sacrificial layer is produced having the same shape as the first part of the conductive layer L but is larger and covers the first part of the conductive layer L. Consequently, the part of the sacrificial layer likewise has circular regions and webs. See FIG. 2. A radius of the circular regions of the part of the sacrificial layer is about 8 $\mu$m. As a result of the structuring of the sacrificial layer and of the second insulating layer I2, the second parts 4 of the lower conductive layer L are exposed.

Then, an upper conductive layer F made of polysilicon is deposited at a thickness of about 1 $\mu$m and implanted, until the dopant concentration is about $10^{18}$ $cm^{-3}$.

In regions in which the webs of the part of the sacrificial layer meet one another, openings are produced in the layer F by masked etching, until the sacrificial layer is exposed.

Figure 4:
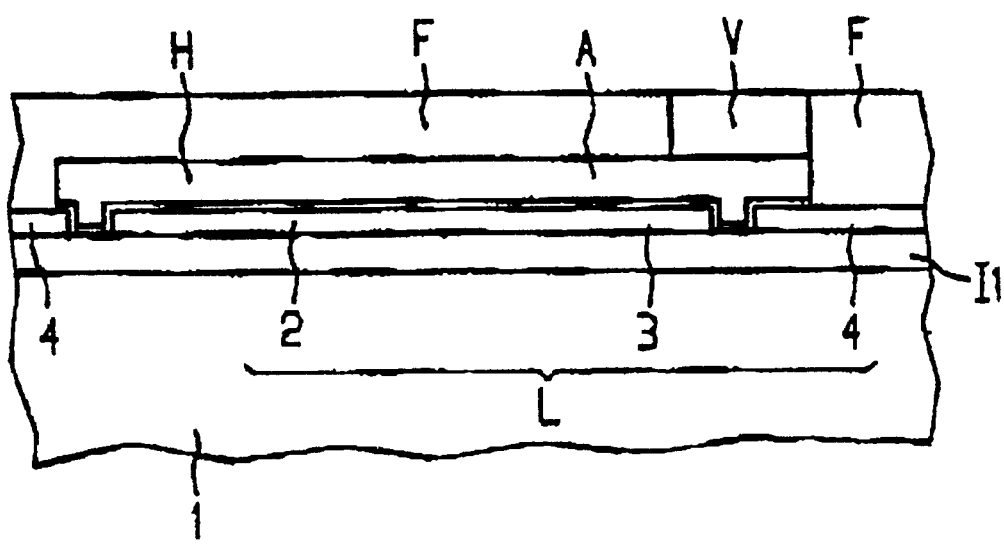
FIG. 4 is a cross-sectional view, at right angles to the cross-section of FIG. 3, through the substrate of FIG. 1 after the pressure sensor has been produced according to the invention.

Using, for example, buffered hydrofluoric acid as an etching agent, the part of the sacrificial layer is removed. In the process, the webs of the part of the sacrificial layer act as etching channels A. Cavities H are produced in the circular regions of the part of the sacrificial layer. See FIGS. 2, 3, and 4. The second insulating layer I2 protects a first insulating layer I1 during the removal of the sacrificial layer at points where the sacrificial layer does not adjoin the lower conductive layer L. See FIG. 3. The upper conductive layer F is supported on the second parts 4 of the lower conductive layer L as shown in FIGS. 3 and 4.

By depositing and fusing BPSG at a thickness of about 800 nm, the cavities H and the etching channels A are sealed. Closures V are produced in the openings and adjoin the etching channels A from above (see FIGS. 2 and 4). A non-illustrated coating layer about 40 nm thick is then deposited.

Parts of the upper conductive layer F that are disposed above the cavities H act as circular membranes of a pressure sensor. The membranes act as electrodes of the capacitors.

Many variations of the exemplary embodiment, which likewise lie within the scope of the invention, are conceivable. For example, dimensions of the regions, layers, webs, and closures can be adapted to the respective requirements.

The polysilicon can also be doped in situ or by diffusion from a dopant source instead of by implantation.

Instead of a coating layer, a passivation layer, which is, for example, 1 $\mu$m thick, can be deposited.

We claim:

1. A micromechanical component, comprising:
   at least one cell having:
      a cavity with a given vertical dimension;
      a membrane acting as an electrode of a capacitor of said at least one cell, said membrane homogeneously disposed with a substantially uniform thickness over said cavity;
      a counter-electrode of said capacitor disposed under said cavity;
      at least one etching channel laterally adjoining said cavity, said at least one etching channel having a vertical dimension equal to said given vertical dimension; and
   at least one closure adjoining said at least one etching channel from above and disposed outside said membrane.

2. The micromechanical component according to claim 1, including an upper conductive layer adjoining said cavity laterally and from above said cavity, said membrane being part of said upper conductive layer.

3. The micromechanical component according to claim 2, including:

a substrate having a surface;

a first insulating layer being disposed on said surface; and a structured lower conductive layer having a first part and a second part, said lower conductive layer being disposed on said first insulating layer, said first part being said counter-electrode, and said upper conductive layer being supported on said second part of said lower conductive layer and being insulated from said first part of said lower conductive layer.

4. The micromechanical component according to claim 3, including a second insulating layer being disposed on said lower conductive layer, said cavity being bounded from below by said second insulating layer.

5. The micromechanical component according to claim 1, wherein:

said membrane has a substantially circular cross section;

said at least one etching channel is at least three etching channels disposed at equal distances from one another;

said at least one cell is a plurality of identical cells, respective groups of three of said cells adjoining one another have respective centers lying at corners of an equilateral triangle; and three etching channels of three different cells meet one another in a region over which said closure is disposed, said closure disposed between said three different cells.

6. The micromechanical component according to claim 5, including an upper conductive layer adjoining said cavity laterally and from above said cavity, said membrane being part of said upper conductive layer;

a substrate having a surface;

a first insulating layer being disposed on said surface;

a structured lower conductive layer having a first part and a second part, said lower conductive layer being disposed on said first insulating layer, said first part being said counter-electrode, and said upper conductive layer being supported on said second part of said lower conductive layer and being insulated from said first part of said lower conductive layer; and conductive webs running in said etching channels, said counter-electrodes of said cells cohering through said conductive webs and, together with said webs, form said first part of said lower conductive layer.

7. The micromechanical component according to claim 3, wherein:

said at least one etching channel is at least three etching channels disposed at equal distances from one another;

said at least one cell is a plurality of identical cells, respective groups of three of said cells adjoining one another have respective centers lying at corners of an equilateral triangle; and including conductive webs running in said etching channels, said counter-electrodes of said cells cohering through said conductive webs and, together with said webs, form said first part of said lower conductive layer.

8. The micromechanical component according to claim 1, wherein:

said at least one etching channel is at least three etching channels disposed at equal distances from one another;

said at least one cell is a plurality of identical cells, respective groups of three of said cells adjoining one another have respective centers lying at corners of an equilateral triangle; and including:

an upper conductive layer adjoining said cavity laterally and from above said cavity, said membrane being part of said upper conductive layer;

a substrate having a surface;

a first insulating layer being disposed on said surface;

a structured lower conductive layer having a first part and a second part, said lower conductive layer being disposed on said first insulating layer, said first part being said counter-electrode, and said upper conductive layer being supported on said second part of said lower conductive layer and being insulated from said first part of said lower conductive layer; and conductive webs running in said etching channels, said counter-electrodes of said cells cohering through said conductive webs and, together with said webs, form said first part of said lower conductive layer.

9. A high-pressure sensor for measuring pressures over 40 bar, comprising:

at least one cell having:
a cavity with a given vertical dimension;
a membrane acting as an electrode of a capacitor of said at least one cell, said membrane homogeneously disposed with a substantially uniform thickness over said cavity, said membrane having a diameter less than 30 $\mu$m;
a counter-electrode of said capacitor disposed under said cavity;
at least one etching channel laterally adjoining said cavity, said at least one etching channel having a vertical dimension equal to said given vertical dimension; and at least one closure adjoining said at least one etching channel from above and disposed outside said membrane.

10. A process for fabricating a micromechanical component, which comprises:

producing a sacrificial layer over a counter-electrode of a capacitor of a cell;

structuring the sacrificial layer to fill a region of a cavity to be produced in the cell and to fill an etching channel laterally adjacent to the cavity;

conformally applying an upper conductive layer over the sacrificial layer;

producing an opening into the upper conductive layer through the etching channel reaching as far as the sacrificial layer;

etching the sacrificial layer to produce the cavity, a part of the upper conductive layer disposed over the cavity becoming capable of being deflected and acting as a membrane of the cell and as an electrode of the capacitor; and closing the etching channel in a region of the opening from above with a closure.

11. The process according to claim 10, which further comprises:
- producing a first insulating layer on a substrate;
- depositing a lower conductive layer over the first insulating layer and structuring the lower conductive layer to produce a first part of the lower conductive layer forming a counter-electrode and to produce a second part of the lower conductive layer separated from the first part;
- producing a second insulating layer over the first conductive layer;
- producing the sacrificial layer over the second insulating layer, the sacrificial layer to be etched selectively with respect to the second insulating layer;
- analogously structuring the second insulating layer and the sacrificial layer to have the second insulating layer completely cover the first part of the lower conductive layer with the second part of the lower conductive layer acting as an etch stop; and
- producing the upper conductive layer over the sacrificial layer to partly adjoin the upper conductive layer laterally with the sacrificial layer.

* * * * *